United States Patent [19]

Pasqualini

[11] Patent Number: 5,428,303
[45] Date of Patent: Jun. 27, 1995

[54] BIAS GENERATOR FOR LOW GROUND BOUNCE OUTPUT DRIVER

[75] Inventor: Ronald Pasqualini, Los Altos, Calif.

[73] Assignee: National Semiconductor Corporation, Santa Clara, Calif.

[21] Appl. No.: 246,689

[22] Filed: May 20, 1994

[51] Int. Cl.⁶ .................. H03K 17/16; H03K 19/003
[52] U.S. Cl. ................................. 326/27; 326/29; 326/31
[58] Field of Search ............... 307/443, 263, 296.8

[56] References Cited

U.S. PATENT DOCUMENTS

| | | | |
|---|---|---|---|
| 4,584,492 | 4/1986 | Sharp | 307/475 |
| 4,638,187 | 1/1987 | Boler et al. | 307/451 |
| 4,645,998 | 2/1987 | Shinohara et al. | 323/313 |
| 4,777,389 | 10/1988 | Wu et al. | 307/443 |
| 4,782,252 | 11/1988 | Levy et al. | 307/576 |
| 4,797,579 | 1/1989 | Lewis | 307/443 |
| 4,820,942 | 4/1989 | Chan | 307/542 |
| 4,894,561 | 1/1990 | Nogami | 307/443 |
| 4,933,574 | 6/1990 | Lien et al. | 307/446 |
| 4,959,565 | 9/1990 | Knecht et al. | 307/542 |
| 4,961,010 | 10/1990 | Davis | 307/443 |
| 5,008,568 | 4/1991 | Leung et al. | 307/451 |
| 5,021,684 | 6/1991 | Ahuja et al. | 307/443 |
| 5,028,817 | 7/1991 | Patil | 307/443 |
| 5,028,818 | 7/1991 | Go Ang et al. | 307/443 |
| 5,034,637 | 7/1991 | Jungert | 307/542 |
| 5,036,222 | 7/1991 | Davis | 307/443 |
| 5,036,232 | 7/1991 | Jungert et al. | 307/542 |
| 5,049,763 | 9/1991 | Rogers | 307/443 |
| 5,055,714 | 10/1991 | Obregon | 307/443 |
| 5,059,822 | 10/1991 | Dukes | 307/443 |
| 5,089,721 | 2/1992 | Luich | 307/443 |
| 5,109,166 | 4/1992 | Coburn et al. | 307/451 |
| 5,111,076 | 5/1992 | Tarng | 307/446 |
| 5,121,000 | 6/1992 | Naghshineh | 307/443 |
| 5,124,579 | 6/1992 | Naghshineh | 307/443 |
| 5,148,056 | 9/1992 | Glass et al. | 307/443 |
| 5,149,991 | 9/1992 | Rogers | 307/443 |
| 5,153,456 | 10/1992 | Keown | 307/443 |
| 5,168,176 | 12/1992 | Wanlass | 307/443 |
| 5,173,621 | 12/1992 | Fraser et al. | 307/443 |
| 5,173,627 | 12/1992 | Lien | 307/443 |
| 5,206,544 | 4/1993 | Chen et al. | 307/443 |
| 5,214,320 | 5/1993 | Truong | 307/443 |
| 5,229,666 | 7/1993 | Sandhu | 307/530 |
| 5,248,907 | 9/1993 | Lin et al. | 307/443 |
| 5,268,868 | 12/1993 | Kajigaya et al. | 365/206 |

*Primary Examiner*—Edward P. Westin
*Assistant Examiner*—Stephen Calogero
*Attorney, Agent, or Firm*—Limbach & Limbach; H. Donald Nelson; Richard J. Roddy

[57] ABSTRACT

A bias generator circuit provides a bias control signal to the gate of a PMOS transistor which has been added to the inverter which drives the final NMOS pull-down transistor of a CMOS output driver circuit. The bias generator circuit includes a constant current source flowing from the positive supply. The bias generator circuit also includes a current difference circuit containing a resistive divider which drives the gate of an NMOS ballast transistor. This ballast transistor has process/voltage/temperature (PVT) characteristics corresponding to those of the final NMOS pull-down transistor in the CMOS output driver. The channel length of the NMOS ballast transistor and the final NMOS pull-down transistor are drawn the same. The ballast transistor subtracts a PVT adjusted current from the constant current source to produce a PVT adjusted output charging current. A down current mirror includes two PMOS transistors which are mirrored in the inverter which drives the final pull-down transistor of the CMOS output driver circuit. Thus, when this inverter is turned on, the charging current which flows at its output will mirror the PVT adjusted charging current flowing in the down current mirror. This produces a PVT adjusted voltage ramp on the gate of the final NMOS pull-down transistor. This PVT adjusted voltage ramp provides two important benefits: significantly reduced ground bounce and output driver falling delay which is independent of existing PVT conditions.

7 Claims, 6 Drawing Sheets

BIAS GENERATOR FOR LOW GROUND BOUNCE OUTPUT DRIVER

BACKGROUND OF THE INVENTION

1. Field of the Invention

The present invention is directed to an input/output (I/O) buffer circuit and, in particular, to a low ground bounce output driver that in its preferred embodiment, utilizes novel bias generator circuitry to minimize both ground bounce and $V_{cc}$ bounce while providing nearly constant propagation delay independent of processing-/voltage/temperature (PVT) variations.

2. Discussion of the Prior Art

High speed CMOS I/O buffers during large capacitive loads can generate very large transient ground currents when their outputs switch from high to low. These transient ground currents must flow through the parasitic ground line inductance which is inevitably present. (This parasitic inductance is primarily composed of package leadframe inductance, bondwire inductance and PC board trace inductance). Large transient ground currents flowing through this inductance can generate large transient voltage spikes on the on-chip ground lines, causing them to become very noisy. This well-known phenomenon, commonly known as "ground bounce", cart result in several harmful effects. For example, CMOS output drivers which are switching from high to low can adversely affect the logic zero output voltage produced by non-switching output buffers sharing the same ground line. This problem can become especially severe when, due to package pin limitations, many output drivers must share the same ground line. Ground bounce can also adversely affect mixed signal CMOS products containing on-chip analog circuitry.

FIG. 1 shows a conventional output driver circuit 10. When the input signal (data-in) to the output driver 10 is a logical high, predriver inverter 12 causes PMOS pull-up transistor 14 to be on and predriver inverter 16 causes NMOS pull-down transistor 18 to be off resulting in a logical high signal at the output pad 20. Conversely, when the input signal (data-in) is a logical low, PMOS transistor 14 is off and NMOS transistor 18 is on resulting in a logical low signal at the output pad 20.

FIG. 2 shows a CMOS circuit having eight I/O buffers connected to a shared on-chip ground line. The output drivers are of the type shown in FIG. 1, but only the NMOS pull-down transistor 18 of the FIG. 1 circuit is shown for each output driver. Of course, those skilled in the an will appreciate that any number of output drivers can be connected to the shared ground line.

Several prior an solutions to the ground bounce problem simply slow down the speed of the circuit. This solution is undesirable, however, because it results in decreased circuit performance.

U.S. Pat. No. 5,214,320 discloses a design technique for controlling the high-to-low transition time, and thus the ground bounce, of the output signal of a CMOS output driver. More specifically, the '320 patent discloses the use of an additional FET in the predriver inverter which drives the n-channel pull-down transistor. This FET is driven by a separate voltage reference signal which is above the threshold of the FET. Thus, while the additional FET is not fully on or fully off, it introduces additional resistance into the predriver, slowing down the rate of charge supplied to the gate of the n-channel pull-down transistor, in correspondence to the magnitude of the voltage reference signal. Reducing the charging rate supplied to the n-channel output device increases it's turn-on time, thereby increasing the switching time of the output signal. As a result, the magnitude of the ground bounce introduced by the output buffer is reduced, albeit at some cost in circuit performance.

The speed of the circuit disclosed in the '320 patent must be guaranteed under weak PVT conditions. When this is achieved, the same circuit must also perform to the same speed specifications under strong PVT conditions. Strong PVT conditions will cause the circuit to operate faster, however, resulting in unnecessary additional speed at the cost of additional ground bounce. Although the '320 patent discloses a reference voltage generator which provides some PVT compensation, this generator cannot be designed to produce the same circuit speed under weak PVT and strong PVT conditions.

It would therefore be highly desirable to have available a bias generator circuit which will slow down the output driver circuit under strong PVT conditions, but not under weak PVT conditions, resulting in a constant circuit operating speed which is independent PVT conditions. As discussed below, the present invention contains a bias generator circuit which reduces ground bounce and causes the speed of the circuit to be the same under both strong and weak PVT conditions.

SUMMARY OF THE INVENTION

In accordance with the present invention, a novel bias generator circuit provides very low ground bounce for any specified set of output driver circuit conditions. In the preferred embodiment, the topological dual of the bias generator circuit is utilized to control $V_{cc}$ bounce, providing the advantages of low ground bounce, low Vcc bounce and constant out:put buffer delay independent of variations in processing, $V_{cc}$ voltage and temperature (PVT). The circuit causes no degradation to the I/O buffer DC drive capability, since a series resistor is not required in the output current path. The circuit also allows the user to easily trade off discharge time versus ground bounce. This can be accomplished using a metal mask option to adjust the width of a "key" transistor located inside the bias generator circuitry. The width of this transistor can also be adjusted under software control, using an on-chip bounce control register. In the "extreme" case, bounce control can be completely disabled by omitting the bias generator and grounding the bias voltage input to the pulldown predriver inverter.

A bias generator circuit in accordance with the present invention provides a bias control voltage to the gate of a p-channel transistor. This transistor is added in series with the p-channel transistor already present in the predriver inverter which drives the pull-down transistor of a conventional output driver. The bias generator circuit includes a reference current generator which produces a constant current flowing from the positive supply. A current difference circuit includes a resistive divider which drives the gate of an NMOS "ballast" transistor. This ballast transistor has PVT characteristics identical to those of the NMOS pull-down transistor present in the output driver, including the same drawn channel length. The ballast transistor subtracts a PVT adjusted current from the constant current source to produce a PVT adjusted output current. A down current mirror forces the same PVT adjusted current to flow through two PMOS transistors located within this current mirror. These transistors have the same length and width as the two PMOS devices in the pull-down predriver. Thus, when the predriver is on, the charging current which flows in the predriver will be identical to the PVT adjusted charging current which flows in the down current mirror. This results in a PVT adjusted voltage ramp on the gate of the final n-channel pull-down transistor located in the I/O driver.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 3:
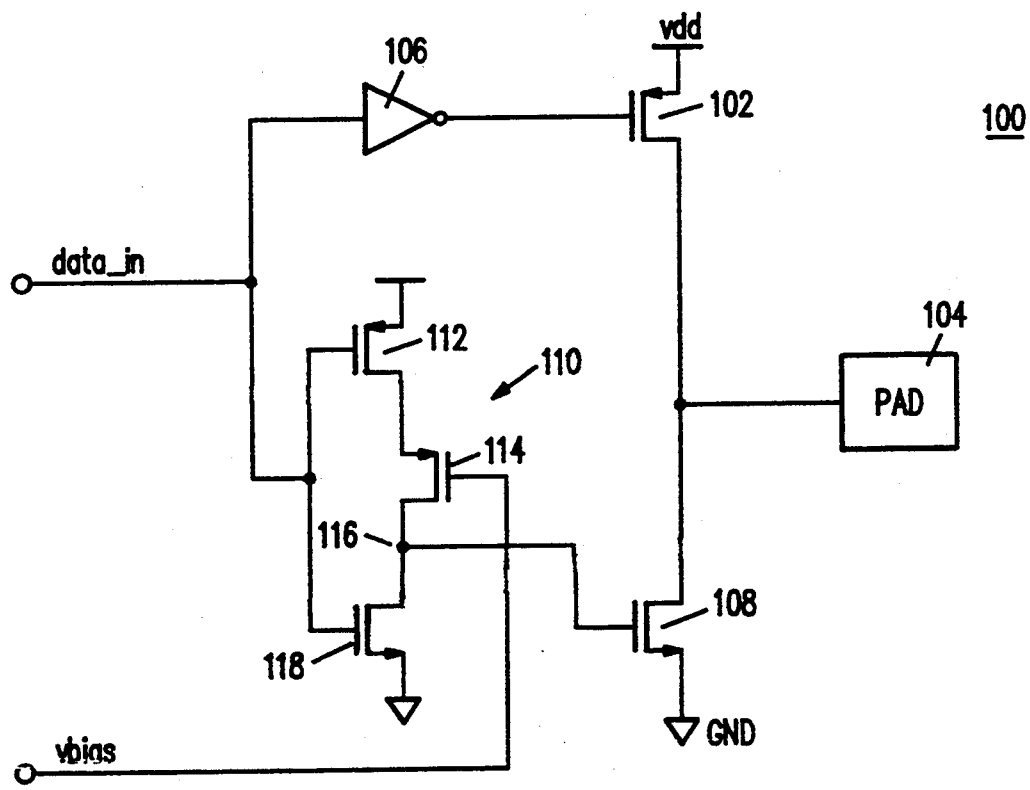
FIG. 3 is a schematic diagram illustrating a known output driver circuit.
Figure 2:
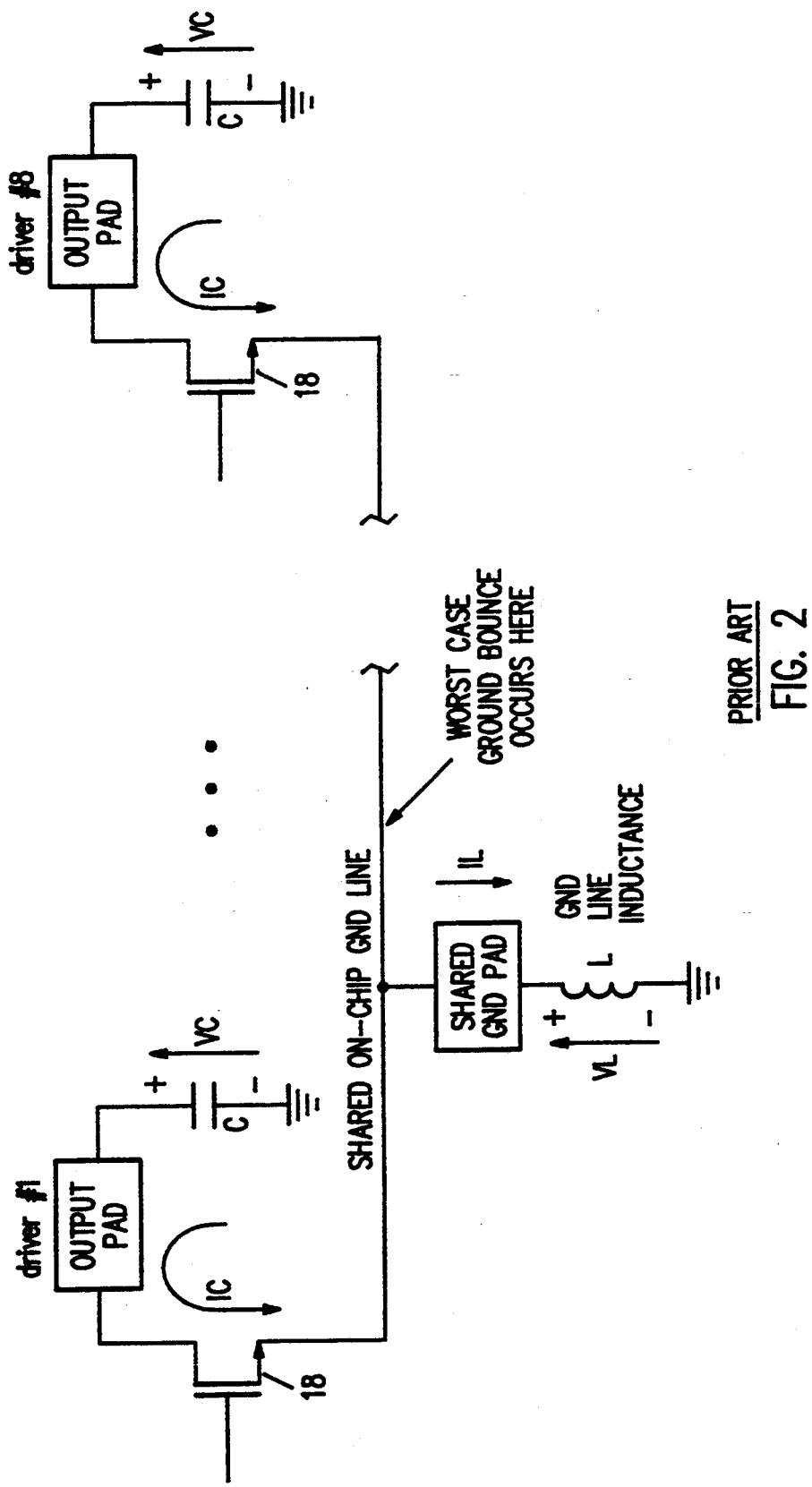
FIG. 2 is a schematic diagram illustrating the NMOS pull-down transistors present in eight output drivers of the type shown in FIG. 1. These NMOS transistors are connected to a shared on-chip ground line.

FIG. 3 shows a low ground bounce output driver circuit 100 that includes a PMOS pull-up transistor 102 connected between an output pad 104 and a positive supply terminal $V_{dd}$. A pull-up predriver inverter 106 is connected to provide the logical complement of a data input signal (data-in) to the gate of the PMOS pull-up transistor 102. As further shown in FIG. 3, NMOS pull-down transistor 108 is connected between the output pad 104 and a negative supply terminal GND. (The parasitic ground line inductance is not shown). A pull-down predriver inverter 110 is connected to provide the logical complement of the data input signal (data-in) to the gate of the NMOS pull-down transistor 108. The pull-down predriver inverter 110 includes a first PMOS transistor 112 which is connected in series with a second PMOS transistor 114 between the positive supply terminal and the pull-down predriver inverter output node 116. The first PMOS transistor 112 has its gate connected to receive the data input signal (data-in). The second PMOS transistor 114 has its gate connected to receive the control signal Vbias. The pull-down predriver 110 further includes an NMOS transistor 118 connected between the predriver inverter output node 116 and the negative supply terminal GND. The NMOS transistor 118 is also driven by the data input signal (data-in). The output of the pull-down predriver 110, which is provided at node 116, drives the NMOS pull-down device 108.

Figure 4:
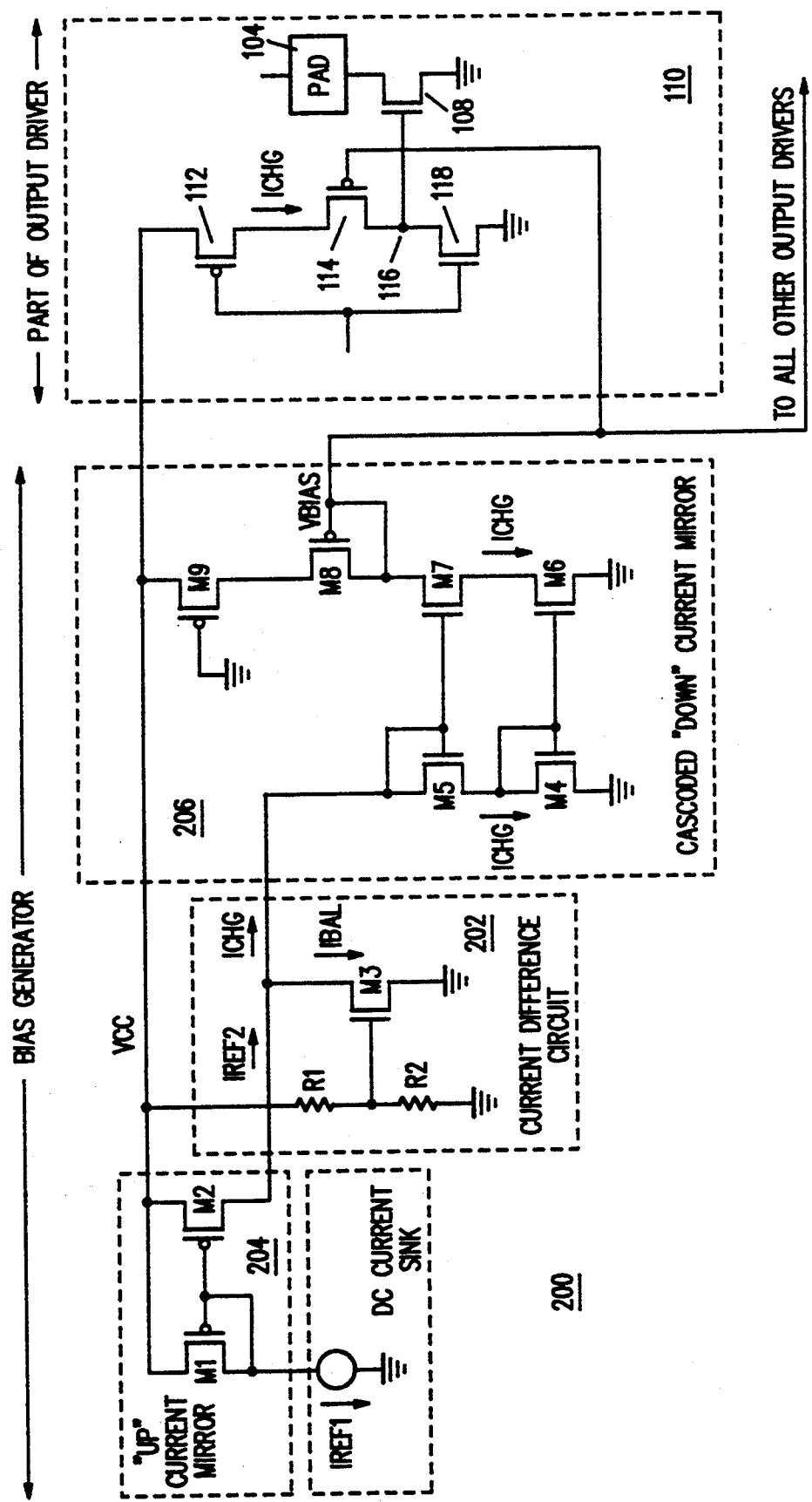
FIG. 4 is a schematic diagram illustrating a bias generator circuit which provides a control signal to the FIG. 3 output driver in accordance with the present invention. A portion of the FIG. 3 output driver is also shown.
Figure 5A:
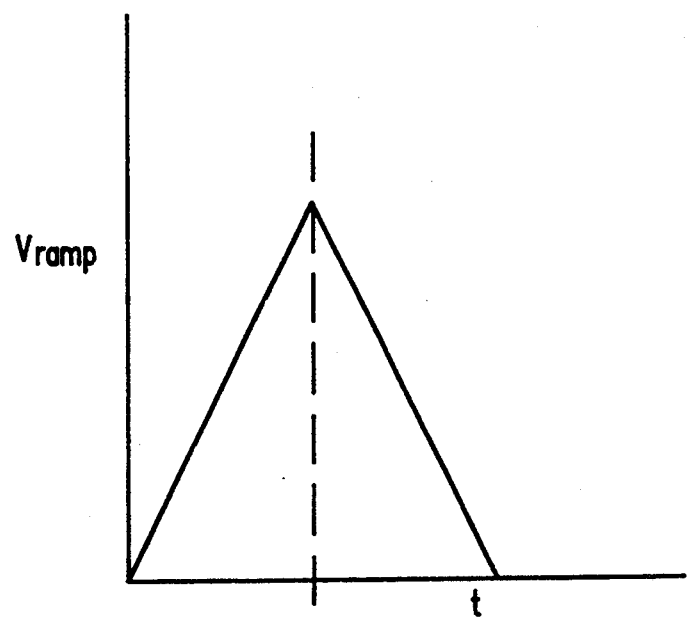
FIGS. 5A is a graph of the ramp voltage imposed on the gate of pull-down transistor 108 versus time, in accordance with the present invention.

FIG. 4 shows a bias generator circuit 200 in accordance with the present invention. This bias generator causes a "constant" PVT adjusted charging current to appear at the output of the pull-down predriver, node 116. This PVT adjusted charging current produces a PVT adjusted voltage ramp on the gate of transistor 108. The waveform for this voltage ramp is shown in FIG. 5A.. The slope of this voltage ramp depends upon the existing PVT conditions. Under strong PVT conditions a shallower slope will be produced. This shallower slope exactly compensates for the fact that transistor 108 is too strong under strong PVT conditions. If this slope compensation were not applied, the high to low transition time at the drain of transistor 108 would be too fast. This faster transition time would cause additional ground bounce to occur. Thus, by preventing a faster high to low transition time under strong PVT conditions, the bias generator completely eliminates the additional ground bounce which would result from this faster transition time.

CMOS I/O circuits are almost always designed to provide minimum required operating speed under weak PVT conditions. Thus, under weak PVT conditions, the bias generator does not slow down the circuit as it did under strong PVT conditions. The bias generator avoids slowing down the circuit, under weak PVT conditions, by providing a higher PVT adjusted charging current at the output of the pull-down predriver, node 116. This higher charging current produces a steeper voltage ramp on the gate of transistor 108. The increased slope of this steeper voltage ramp exactly compensates for the weakness of transistor 108 under weak PVT conditions.

From the foregoing circuit description, those skilled in the art will appreciate that, at strong PVT (fast process, high Vcc, low temperature), there is a unique voltage which when applied to the gate of transistor 114 will produce exactly the desired driver delay (i.e. high-to-low transition time at output pad 104). Similarly, at weak PVT (slow process, low Vcc, high temperature), there is also a unique voltage, different from the strong PVT voltage, that results in the same driver delay as in the strong PVT case. In accordance with the present invention bias generator circuit 200 provides a Vbias control signal to the predriver of transistor 108 such that when transistor 112 is on and transistor 118 is off, a "constant" charging current ICHG flows through transistors 112 and 114, causing the gate voltage of transistor 108 to increase linearly with time. This "constant" current is adjusted according to existing PVT conditions. (Those skilled in the art will appreciate that the series order of PMOS transistors 112 and 114 can be reversed without impacting circuit functionality.) More specifically, if strong PVT conditions exist, then the magnitude of the charging current ICHG will be appropriately reduced, decreasing the slope of the voltage ramp on the gate of pull-down transistor 108. Conversely, under weak PVT conditions, the magnitude of the charging current ICHG will be appropriately increased, increasing the slope of the voltage ramp on the gate of transistor 108.

Figure 5B:
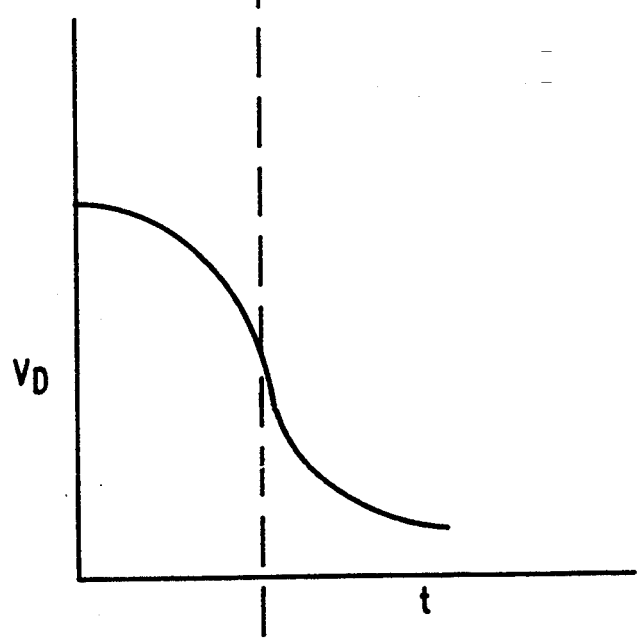
FIGS. 5B is a graph of the parabolic voltage waveform which occurs on the drain of pull-down transistor 108 versus time, in accordance with the present invention.

If we designate the load capacitance which is being driven by transistor 108 as 'C', the voltage across this capacitance as 'VC', the parasitic ground line inductance which is present as 'L', and the voltage across this inductance as 'VL', it can be easily shown that VL is equal to the second time derivative of VC multiplied by the quantity −LC. Since the values of L and C are more or less fixed in any given application, the second time derivative of VC is the only parameter which can be manipulated in order to trade off circuit operating speed (i.e. buffer falling delay) vs ground bounce. As previously described, the gate of transistor 108 is driven by a voltage ramp under both strong and weak PVT conditions. This causes the high to low transition at pad 104 (i.e. the voltage VC) to be a parabolic waveform as shown in FIG. 5B. This parabolic waveform has a second time derivative which is initially zero and which remains relatively low in magnitude for all time. Therefore, those skilled in the art will appreciate that the peak ground bounce generated by the circuit shown in FIG. 4 will be less than that produced by other more conventional circuits described under prior art, including the standard output driver 10 shown in FIG. 1.

Figure 1:
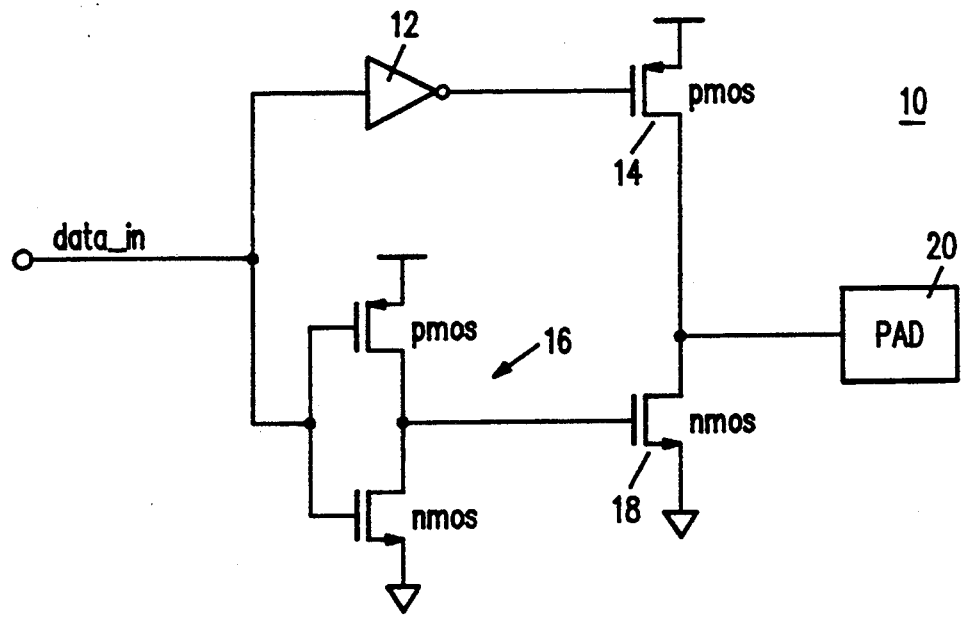
FIG. 1 is a schematic diagram illustrating a conventional output driver circuit.

The design procedure for a low ground bounce circuit in accordance with the present invention begins with the design of a standard I/O buffer, such as that shown in FIG. 1. Under weak PVT conditions this circuit must drive the specified load capacitance with a falling delay which is slightly less (by approximately 10%) than the maximum falling delay allowed. The width of the NMOS driver transistor 108 should not be made grossly larger than the minimum width necessary to meet the falling delay requirement; doing so will increase the minimum ground bounce achievable by the circuit.

A PMOS transistor 114 is then added to the standard predriver inverter, as shown in FIG. 3. The initial width of transistor 114 should be chosen to be twice the width of the PMOS pull-up transistor 112 which is already present. The gate voltage of the added PMOS transistor 114 is then set to 0 V and the circuit is re-simulated. If the falling delay is still acceptable, then the design proceeds to the next step. If the falling delay is too slow, the width of the added PMOS transistor 114 must be increased until the falling delay is acceptable. If the falling delay cannot be made acceptable, or if the width of the added PMOS transistor 114 becomes excessive, then the width of NMOS transistor 108 is too small and must be increased. This step is not normally required unless the width of NMOS device 108 was initially set close to its absolute minimum value.

In the next step of the design procedure, the optimum value of the Vbias voltage at weak PVT, i.e. VBISmin, is determined. This is done by performing a parametric simulation in which the Vbias voltage is varied and the resulting falling delay time is recorded. The optimum value of the Vbias voltage at weak PVT is that value, VBIASmin, which gives exactly the required falling delay time.

In the next design step the optimum Vbias voltage for strong PVT operating conditions, i.e. VBIASmax, is determined. This is done by performing a parametric simulation in which the Vbias voltage is varied and the resulting falling delay time is recorded. As previously described, this procedure produces a curve of falling delay time versus Vbias voltage. The optimum value of the Vbias voltage at strong PVT is that value, VBIASmax which gives exactly the required falling delay time.

As described in detail below a bias generator circuit 200 is then designed to provide VBIASmin and VBIASmax at weak and strong PVT conditions, respectively.

Referring to FIG. 4, bias generator circuit 200 includes a current difference circuit 202 which requires a constant current source, IREF2. IREF2 is provided by mirroring a constant current current sink, IREF1, in the illustrated embodiment. This mirroring is provided by an "up" current mirror which includes PMOS transistors M1 and M2. Those skilled in the an will appreciate that this mirroring will not be required in embodiments where a constant current source, IREF2, is directly available.

The current difference circuit 202 includes an NMOS ballast transistor M3. Since this transistor and the NMOS pulldown transistor 108 are both fabricated in the same process flow, both devices will have matching PVT characteristics in accordance with the present invention. In order to obtain optimum matching of transistor characteristics, the drawn channel length of transistor M3 and the drawn channel length of transistor 108 must be made identical. This common channel length would normally be set to the minimum channel length supported by the CMOS process being used.

The drive signal for NMOS ballast transistor M3 is provided by a resistive divider which includes resistors R1 and R2. The values of these resistors must be chosen with regard to the highest N-channel threshold voltage that can occur and the lowest Vcc voltage that can occur. Thus, under minimum Vcc conditions, these two resistances should be chosen to provide a minimum output voltage, where they join, that is slightly greater than the highest N-channel threshold voltage which can occur. This will ensure that N-channel device M3 will be in its saturated region, the same as NMOS pulldown transistor 108 when the latter device initially turns on.

The constant current input IREF2 to the current difference circuit 202, minus the current flowing through ballast transistor M3, result in a PVT adjusted output charging current ICHG from the current difference circuit 202. Those skilled in the an will appreciate that as the PVT strength and/or W/L ratio of ballast transistor M3 are decreased the amount of output charging current ICHG will be increased. Conversely, as the PVT strength and/or W/L ratio of ballast transistor M3 are increased, the amount of output charging current ICHG will be decreased.

As shown in FIG. 4, circuit 206 serves as a cascoder "down" current mirror which receives the charging current ICHG and allows it to flow through the series connected NMOS transistors M4 and M5. Since the series connected NMOS transistors M6 and M7 mirror the series connected transistors M4 and M5, the same current value, ICHG, will flow through M6 and M7. Those skilled in the art will appreciate that the down current mirror 206 is cascoder since this is the ideal design for typical 5 V CMOS voltage supply levels utilized in the disclosed embodiment. However, in other low voltage circuits, such as those operating at 3 V or 3.3 V, a non-cascoded mirror design would be sufficient.

As shown in FIG. 4, the same charging current ICHG which flows through NMOS transistors M6 and M7 also flows through the series connected PMOS transistors M8 and M9. Additionally, PMOS transistor M8 in the down current mirror 206 is mirrored by PMOS transistor 114 in pull-down predriver inverter 110. Similarly, PMOS transistor M9 in the down current mirror 206 is mirrored by PMOS transistor 112 in pull-down predriver inverter 110. Thus, when the output of the pull-down predriver inverter goes "high", the current which flows through PMOS transistors 112 and 114 to node 116 will the same as the ICHG current flowing through PMOS transistors M8 and M9.

The final step in the design procedure is to determine the optimum combination of reference current IREF1 and width of the current difference transistor M5. The optimum combination of these two parameters will produce VBIASmin under weak PVT conditions and VBIASmax under strong PVT conditions. The optimum combination of IREF1 and the width of device M5 can be obtained by performing parametric simulations on the current difference circuit as follows:

(1) Choose an initial value for IREF1.
(2) Perform a parametric simulation for the weak PVT condition, in which the width of transistor M5 is varied and the resulting Vbias voltage is recorded. Plot the Vbias voltage versus the width of transistor M5.
(3) Perform a parametric simulation for the strong PVT condition, in which the width of transistor M5 is varied over the same range as in step 2 and the resulting value of the Vbias voltage is recorded. Plot the Vbias voltage versus the width of transistor M5 on the same graph as in step 2 (both plotted curves will slope downward to the right).
(4) Examine the graph generated in step 3 to determine if there is a value for the width of device M5 that gives both the desired VBIASmin on the weak PVT curve and the desired VBIASmax on the strong PVT curve. If there is such a value, this value for the width of transistor M5 and the value chosen for IREF1 are the optimum values for producing minimum ground bounce while exactly meeting the output driver falling delay requirement. If there is no such value, then the value of IREF1 is changed and steps 1–3 are repeated until the condition specified in step 4 is satisfied.

As stated above, the output driver circuit 100 allows an easy trade off of discharge time versus ground bounce. In the "extreme" case, the low ground bounce feature of circuit 100 can be disabled by simply grounding the Vbias line utilizing a switch (not shown). This will result in maximum circuit speed and maximum ground bounce.

Figure 6:
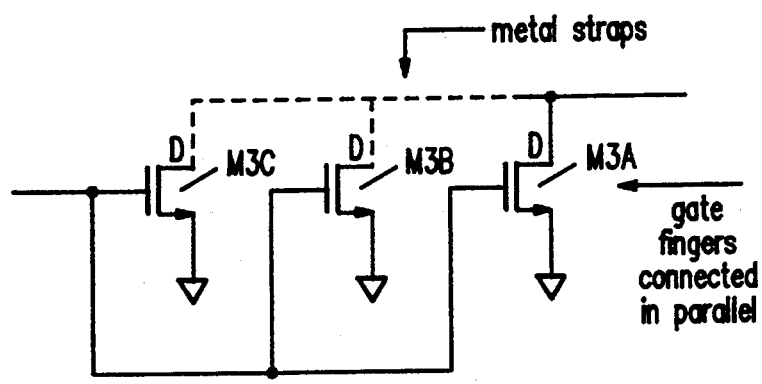
FIG. 6 is a schematic diagram illustrating the use of a metal strapping option to change the width of the NMOS ballast transistor utilized in the FIG. 4 bias generator circuit.

Alternatively, a metal strapping option can be used to change the width of ballast transistor M3. As an example of this, three NMOS devices M3A, M3B and M3C may be provided with their gate fingers connected in parallel, as shown in FIG. 6. A metal mask strapping option can be utilized to determine whether transistor M3 will consist of 1, 2 or 3 of the devices M3A, M3B and M3C.

Figure 7:
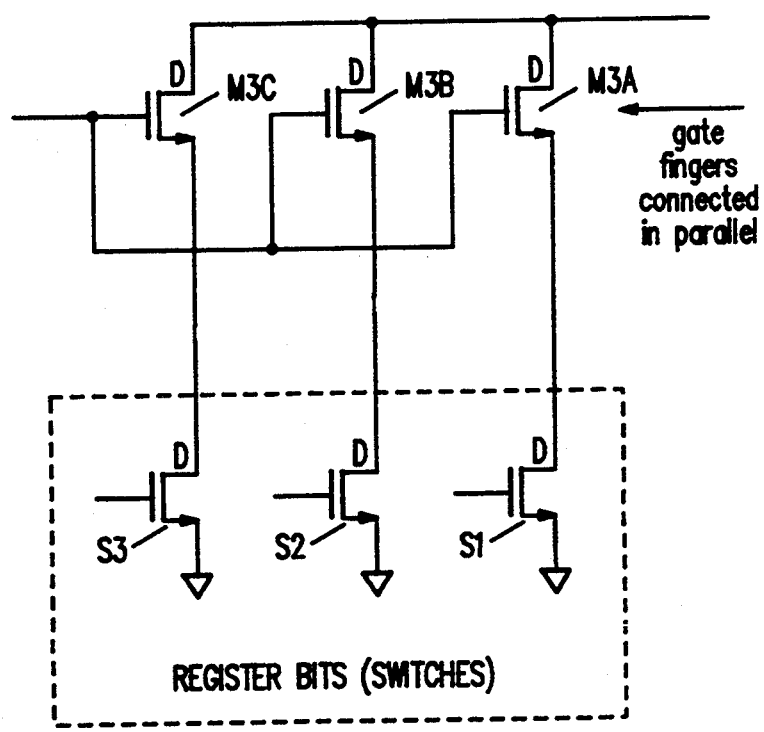
FIG. 7 is a schematic diagram illustrating the use of register bits to change the width of the NMOS ballast transistor utilized in the FIG. 4 bias generator circuit.

According to another option, software control of the width of ballast transistor M3 can be provided via an on-chip bounce control register, as shown in FIG. 7. Register bits, illustrated as NMOS switch transistors S1, S2 and S3, can be used to change the width of transistor M3.

Figure 8:
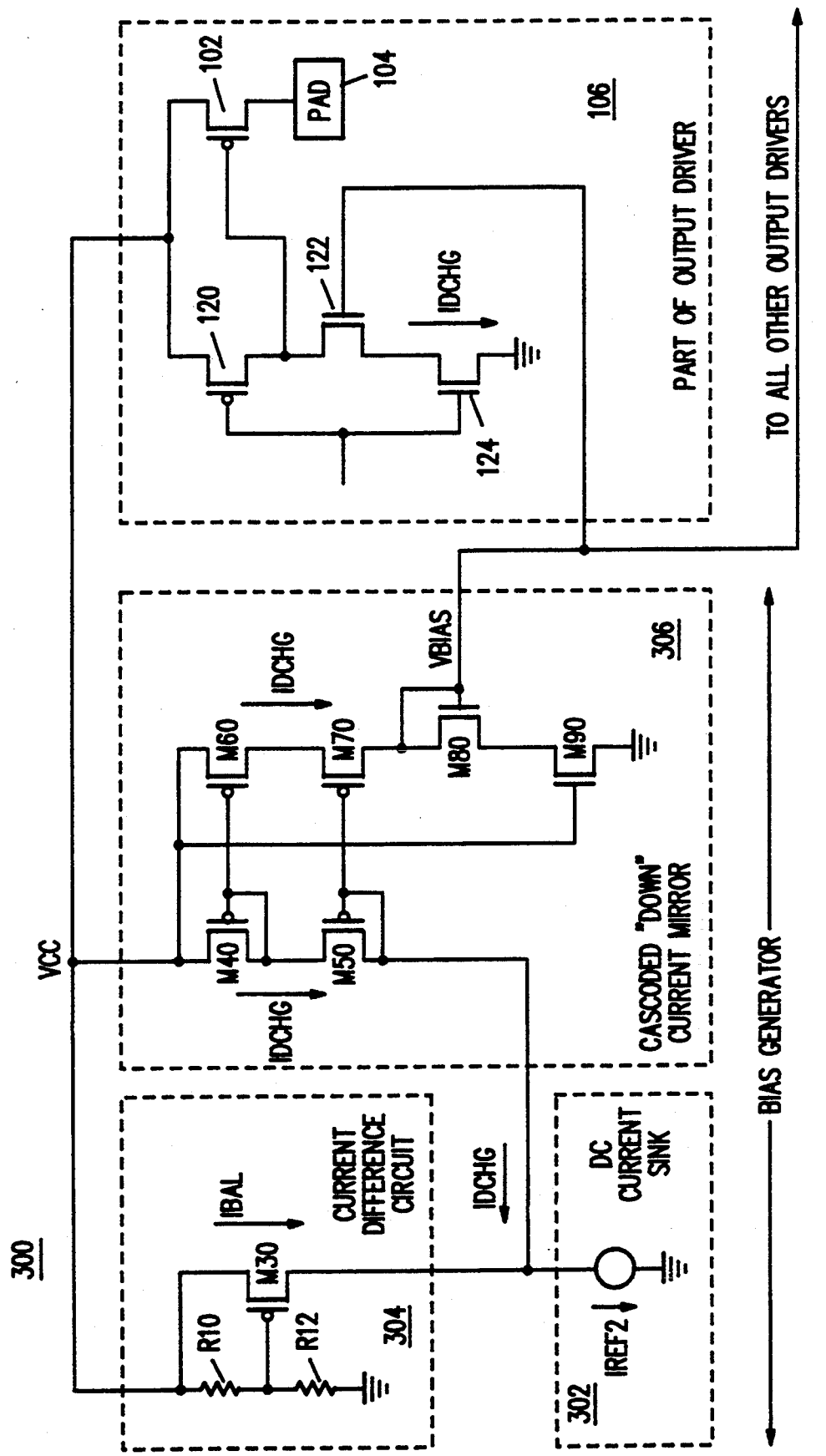
FIG. 8 is a schematic diagram illustrating a bias generator circuit which provides a control signal to the PMOS output transistor predriver, resulting in control of $V_{cc}$ bounce in accordance with the present invention.

As stated above, a preferred embodiment of the present invention also allows control of $V_{cc}$ bounce using circuit techniques similar to those described above with respect to ground bounce control. In this case a second bias generator circuit 300, an embodiment of which is shown in FIG. 8, must be provided. Those skilled in the art will appreciate that the FIG. 8 bias generator circuit 300 is the topological "dual" of the bias generator circuit 200 described in FIG. 4.

FIG. 8 shows a bias generator circuit 300 utilizable for providing a bias control signal Vbias to an NMOS transistor 122 added to the pull-up predriver inverter 106 shown in FIG. 3. In a manner similar to that discussed above with respect to transistor 114 of the pull-down predriver 110, when PMOS transistor 120 of the pull-up predriver 106 is off and NMOS transistor 124 is on, a "constant" discharging current IDCHG flows through transistors 122 and 124 causing the gate voltage of pull-up transistor 102 to decrease linearly with time. As in the case of the charging current ICHG generated by the FIG. 4 circuit 200, the discharging current IDCHG is PVT adjusted. Thus, under strong PVT conditions, the magnitude of the discharging current IDCHG will be appropriately reduced decreasing the slope of the voltage ramp on the gate of pull-up transistor 102. Conversely, under weak PVT conditions, the magnitude of the discharging current IDCHG will be appropriately increased, increasing the slope of the voltage ramp on the gate of transistor 102.

In a manner similar to that described above with respect to pull-down transistor 108, driving the gate of transistor 102 with a voltage ramp results in a parabolic voltage waveform on the drain of transistor 102 and, thus, at output pad 104. This waveform results in lower Vcc bounce in comparison to the standard output driver circuit 10 shown in FIG. 1.

As further shown in FIG. 8, bias generator circuit 300 includes a DC constant current sink 302 which supplies a constant reference current IREF2. A current difference circuit 304 includes a PMOS ballast transistor M30 which is driven by a resistive divider that includes resistors R10 and R12. PMOS transistor M30 has PVT characteristics corresponding to the PVT characteristics of PMOS pull-up transistor 102, and that file channel lengths of both transistors should be drawn the same. The constant reference current IREF2, minus the IBAL current flowing through ballast transistor M30, defines a discharging current IDCHG provided to a cascoded "down" current mirror 306. As in the case of the bias generator circuit 200 described above, a cascoded design is preferred when the supply voltage $V_{cc}$ is 5 V or more. The "down" current mirror 306 causes the discharge current IDCHG to flow through NMOS devices M80 and M90. The discharge current IDCHG is then mirrored in the NMOS transistors 122 and 124 in the predriver circuit 106. This controls the I/O buffer rising delay and $V_{cc}$ bounce in a manner similar to that previously described for the low ground bounce circuit.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. Bias generator circuit, for controlling ground bounce in an output driver circuit, wherein the output driver circuit includes a PMOS pull-up transistor having its drain connected to an output node and its source connected to a positive supply terminal, a pull-up pre-driver inverter connected to receive the data signal as an input and to provide the logical compliment of the data signal to the gate of the PMOS pull-up transistor, an NMOS pull-down transistor having its drain connected to the output node and its source connected to a negative supply terminal, a pull-down predriver inverter connected to receive the data signal as an input and to provide a pull-down predriver output signal corresponding to the logical complement of the data signal to the gate of the NMOS pull-down transistor, the pull-down predriver inverter. including first and second series-connected PMOS transistors connected between the positive supply terminal and a pull-down predriver inverter output node, the first PMOS transistor having its gate connected to receive the data signal the second PMOS transistor having its gate connected to receive a bias control signal, the pull-down predriver inverter further including an NMOS transistor having its gate connected to receive the data signal its drain connected to the inverter output node and its source connected to the negative supply terminal, the inverter output node being connected to the gate of the NMOS pull-down transistor, the bias generator circuit comprising:

a reference current generator (204) for generating a source current (IREF2) flowing from the positive supply;

a current difference circuit (202) that includes a resistive divider (R1/R2) having an output connected to the gate of an NMOS ballast transistor (M3) that subtracts a Process/Voltage/Temperature (PVT) adjusted current from the source current (IREF2) to produce a PVT adjusted output current (ICHG); and a down current mirror (206) connected to the current difference circuit (202) and that includes a first down current mirror PMOS transistor (M9) having its gate connected to the negative supply and that mirrors the first of the series-connected PMOS transistors (112) of the pull-down predriver (110) and a second down current mirror PMOS transistor (M8) having its gate connected to the gate of the second series-connected PMOS transistor (114) of the pull-down predriver (110) such that, when the pull-down predriver (110) is on, the down current mirror (206) mirrors the PVT adjusted charging current so that the charging current ICHG flows through the first and second down current mirror transistors (M8, M9) thereby causing the PVT adjusted current ICHG to flow through the first and second series-connected transistors (112, 114) of the pull-down predriver (110) thereby providing a PVT adjusted voltage ramp on the gate of the pull-down transistor (108) thereby resulting in constant circuit delay independent of PVT.

2. Bias generator circuitry as in claim 1 and wherein the down current mirror (206) further includes a first NMOS down current mirror transistor (M5) having its source coupled to the negative supply and its gate and drain commonly connected to the output of the current difference circuit (202) and a second NMOS down current mirror transistor (M7) having its source coupled to the negative supply and its gate connected to the gate of the first NMOS down current mirror transistor (M5), and wherein the first down current mirror PMOS transistor (M9) has its source connected to the source of the first series-connected PMOS transistor 112 and its drain connected to the source of the second down current mirror PMOS transistor (M8), the commonly-connected gate and drain of the second down current mirror PMOS transistor (M8) being connected both to the gate of the second series-connected PMOS transistor (114) to provide a bias control signal (VBIAS) thereto and to the drain of the second NMOS down current mirror transistor (M7).

3. Bias generator circuitry as in claim 1 and wherein the down current mirror (206) further includes a first NMOS down current mirror transistor (M4) having its source coupled to the negative supply and its gate and drain commonly connected to the source of a second NMOS down current mirror transistor (M5), the gate and drain of the second NMOS down current mirror transistor (M5) being commonly connected to the output of the current difference circuit (202), and a third NMOS down current mirror transistor (M6) having its source connected to the negative supply, its gate connected to the gate of the first NMOS down current minor transistor (M4), and its drain connected to the source of a fourth NMOS down current mirror transistor (M7), the gate of the fourth NMOS down current mirror transistor (M7) being connected to the gate of the second NMOS down current mirror transistor (M5), and wherein the first down current mirror PMOS transistor (M9) has its source connected to the source of the first series-connected PMOS transistor 112 and its drain connected to the source of the second down current mirror PMOS transistor (M8), the commonly-connected gate and drain of the second down current mirror PMOS transistor (M8) being connected both to the gate of the second series-connected PMOS transistor (114) to provide a bias control signal (VBIAS) thereto and to the drain of the fourth NMOS down current mirror transistor (M7).

4. Bias generator circuitry as in claim 1 and wherein the reference current generator (204) includes a DC current sink which provides a reference current (IREF1); and an up current mirror that includes a first PMOS up current mirror transistor (M1) having its source connected to the positive supply and its commonly connected gate and drain connected to the current sink, and a second PMOS up current mirror transistor (M2) having its source connected to the positive supply, its gate connected to the gate of the first PMOS up current mirror transistor (M1) and its drain connected to the drain of the NMOS ballast transistor (M3).

5. Bias generator circuitry as in claim 1 and wherein the NMOS ballast transistor (M3) comprises a plurality of NMOS transistors, each of said NMOS transistors having its source connected to the negative supply, its gate connected in parallel with the gate of each of the other of said NMOS transistors and to receive the output of said resistive divider and its drain selectively connectable to receive the source current (IREF2).

6. Bias generator circuitry as in claim 1 and wherein the NMOS ballast transistor (M3) comprises a plurality of NMOS transistors, each of said NMOS transistors having its source connected to the negative supply, its gate connected in parallel with the gate of each of the other said NMOS transistors, all of the said transistors to receive the output of said resistive divider, and the drains of all of said transistors connected to receive the source current (IREF2), the current difference circuit (202) further including a bounce control register connected to the plurality of said NMOS transistors, and having a plurality of switching transistors, each switching transistor being connected between the source of a said corresponding NMOS transistor and ground, each switching transistor being responsive to a signal applied to its gate to effectively disconnect said corresponding NMOS transistor.

7. Bias generator circuitry for controlling $V_{cc}$ bounce in an output driver circuit, wherein the output driver circuit includes a PMOS pull-up transistor (102) having its drain connected to the output node and its source connected to a positive supply terminal, a pull-up pre-driver inverter (106) connected to receive the data signal as an input and to provide a pull-up predriver output signal corresponding to the logical complement of the data signal to the gate of the PMOS pull-up transistor, the pull-up predriver inverter including first and second series-connected NMOS transistors (124, 122) connected between the negative supply terminal and a pull-up predriver inverter output node, the first NMOS transistor (124) having its gate connected to receive the data signal, the second NMOS transistor (122) having its gate connected to receive a bias control signal (VBIAS), the pull-up predriver inverter further including a PMOS transistor (120) having its gate connected to receive the data signal, its drain connected to the inverter output node and its source connected to the positive supply terminal, the inverter output node being connected to the gate of the PMOS pull-up transistor, the bias generator circuit comprising:

a reference current sink (302) providing a constant sink current (IREF2) to the negative supply;

a current difference circuit (304) that includes a resistive divider (R1/R2) having an output connected to the gate of a PMOS ballast transistor (M30) that subtracts a PVT adjusted current (IBAL) from the sink current (IREF2) to produce a PVT adjusted output discharging current (IDCHG); and a down current mirror (306) connected to the current difference circuit (304) and that includes a first down current mirror NMOS transistor (M90) having its gate connected to the positive supply and that mirrors the first of the series-connected NMOS transistors (124) of the pull-up predriver (106) and a second down current mirror NMOS transistor (M80) having its gate connected to the gate of the second series-connected NMOS transistor (122) of the pull-up predriver (106) such that, when the pull-up predriver (106) is on, the down current mirror (306) mirrors the PVT adjusted charging current so that the discharging current IDCHG flows through the first and second down current mirror transistors (M90, M80) thereby causing the PVT adjusted current IDCHG to flow through the first and second series-connected transistors (124, 122) of the pull-up predriver (106) thereby providing a PVT adjusted voltage ramp on the gate of the pull-up transistor (102).

* * * * *

UNITED STATES PATENT AND TRADEMARK OFFICE
CERTIFICATE OF CORRECTION

PATENT NO. : 5,428,303
DATED : June 27, 1995
INVENTOR(S) : Ronald Pasqualini

It is certified that error appears in the above-indentified patent and that said Letters Patent is hereby corrected as shown below:

In Col. 8, line 66, please add the letters --ry-- to the end of "circuit" to form the word "circuitry".

In Col. 9, line 17 and line 21, please insert --,-- after "signal".

Signed and Sealed this

Twelfth Day of September, 1995

Attest:

BRUCE LEHMAN

Attesting Officer    Commissioner of Patents and Trademarks